(12) United States Patent
Delalleau et al.

(10) Patent No.: US 10,797,158 B2
(45) Date of Patent: Oct. 6, 2020

(54) TRANSISTOR COMPRISING A LENGTHENED GATE

(71) Applicant: STMicroelectronics (Rousset) SAS, Rousset (FR)

(72) Inventors: Julien Delalleau, Marseilles (FR); Christian Rivero, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 17 days.

(21) Appl. No.: 16/036,453

(22) Filed: Jul. 16, 2018

(65) Prior Publication Data

US 2019/0027581 A1 Jan. 24, 2019

(30) Foreign Application Priority Data

Jul. 21, 2017 (FR) ...................................... 17 56936

(51) Int. Cl.
*H01L 29/66* (2006.01)
*H01L 29/423* (2006.01)
*H01L 29/78* (2006.01)
*H01L 21/28* (2006.01)

(52) U.S. Cl.
CPC .. *H01L 29/66598* (2013.01); *H01L 21/28114* (2013.01); *H01L 21/28132* (2013.01); *H01L 29/42372* (2013.01); *H01L 29/42376* (2013.01); *H01L 29/6656* (2013.01); *H01L 29/7836* (2013.01)

(58) Field of Classification Search
CPC ....... H01L 21/28114; H01L 21/823456; H01L 21/82385; H01L 29/42372–4238; H01L 29/66598; H01L 21/28132; H01L 29/42376
See application file for complete search history.

(56) References Cited

U.S. PATENT DOCUMENTS

| 4,728,617 | A | | 3/1988 | Woo et al. |
| 4,818,715 | A | | 4/1989 | Chao |
| 5,837,588 | A | * | 11/1998 | Wu ..................... H01L 21/2652 438/305 |

(Continued)

FOREIGN PATENT DOCUMENTS

| CN | 103178096 A | 6/2013 |
| DE | 19626089 A1 | 1/1998 |

(Continued)

OTHER PUBLICATIONS

Toshiyuki Oishi et al: "Isolation Edge Effect Depending on Gate Length of MOSFET's With Various Isolation Structures," IEEE Transactions on Electron Devices—IEEE Service Center, Piscataway, NJ, US, vol. 47, No. 4, Apr. 1, 2000 (Apr. 1, 2000)—ISSN: 0018-9383 * p. 1-p. 2; Figure 1*.

(Continued)

*Primary Examiner* — Jose R Diaz
(74) *Attorney, Agent, or Firm* — Crowe & Dunleavy

(57) ABSTRACT

A MOS transistor is produced on and in an active zone and included a source region and a drain region. The active zone has a width measured transversely to a source-drain direction. A conductive gate region of the MOS transistor includes a central zone and, at a foot of the central zone, at least one stair that extends beyond the central zone along at least an entirety of the width of the active zone.

10 Claims, 5 Drawing Sheets

(56) References Cited

U.S. PATENT DOCUMENTS

| | | |
|---|---|---|
| 5,976,932 A | 11/1999 | Kerber |
| 6,004,852 A | 12/1999 | Yeh et al. |
| 6,346,467 B1 | 2/2002 | Chang et al. |
| 7,557,404 B2 | 7/2009 | Koh et al. |
| 7,704,883 B2 * | 4/2010 | Butler ............... H01L 21/28035 257/E21.012 |
| 7,723,235 B2 * | 5/2010 | Kurihara ............. H01L 21/0273 216/41 |
| 8,067,807 B2 * | 11/2011 | Taya ................. H01L 21/82385 257/392 |
| 2002/0072173 A1 | 6/2002 | Aoki |
| 2003/0006463 A1 | 1/2003 | Ichikawa |
| 2005/0199939 A1 | 9/2005 | Lutze et al. |
| 2006/0170055 A1 | 8/2006 | Mitros et al. |
| 2009/0236654 A1 | 9/2009 | Ishihara et al. |
| 2010/0032772 A1 | 2/2010 | Tanaka |
| 2010/0158072 A1 | 6/2010 | Fornara et al. |
| 2013/0092987 A1 | 4/2013 | Lopez |
| 2014/0103440 A1 | 4/2014 | Chatterjee |
| 2014/0370680 A1 | 12/2014 | Cheng et al. |

FOREIGN PATENT DOCUMENTS

| | | |
|---|---|---|
| DE | 19747776 A1 | 7/1998 |
| EP | 1501130 A1 | 1/2005 |
| FR | 2826496 A1 | 12/2002 |
| FR | 2831713 A1 | 5/2003 |
| JP | 2001326289 A | 11/2001 |
| WO | 2005083769 A1 | 9/2005 |

OTHER PUBLICATIONS

INPI Search Report and Written Opinion for FR 1756936 dated Mar. 5, 2018 (7 pages).

* cited by examiner

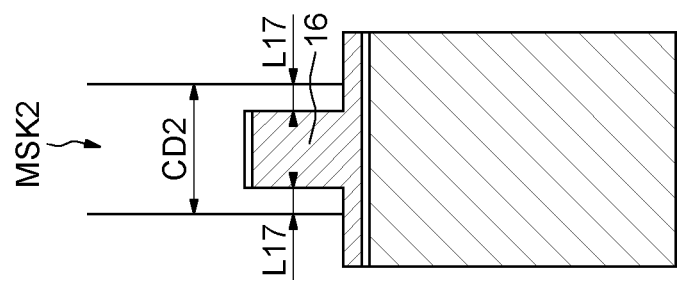
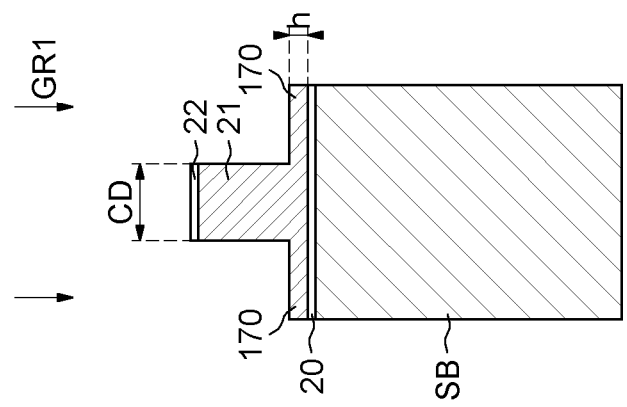
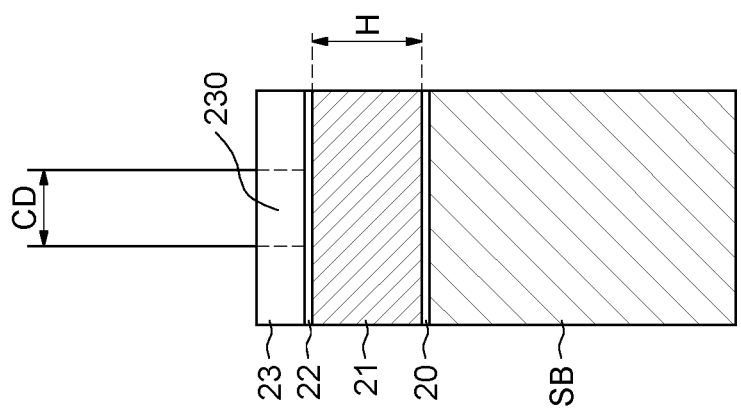

FIG.13
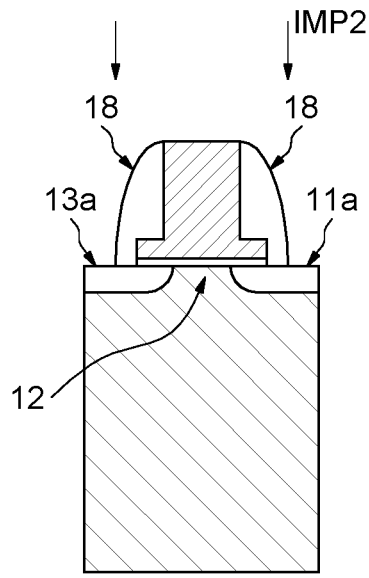
FIG.14
FIG.15
PRIOR ART
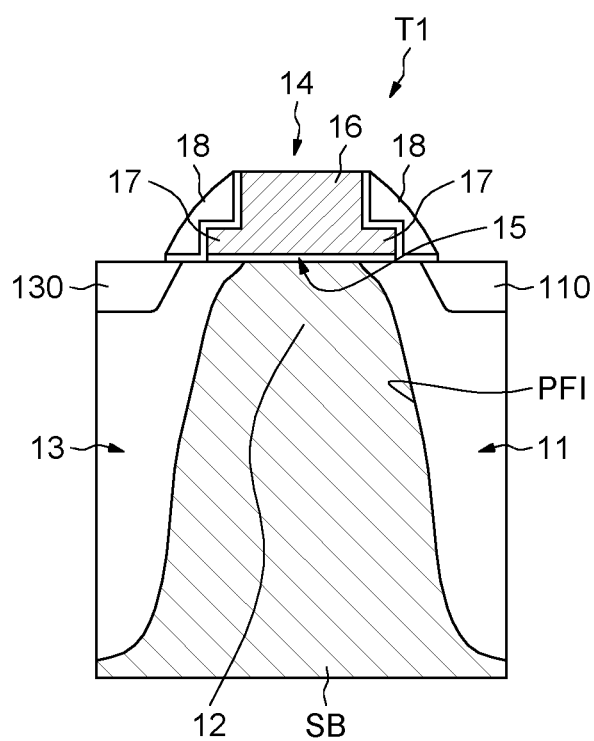

TRANSISTOR COMPRISING A LENGTHENED GATE

PRIORITY CLAIM

This application claims the priority benefit of French Application for Patent No. 1756936 filed on Jul. 21, 2017, the content of which is hereby incorporated by reference in its entirety to the maximum extent allowable by law.

TECHNICAL FIELD

Embodiments of the invention relate to integrated circuits, and in particular to the field-effect transistors known in the art as metal-oxide semiconductor (MOS) field-effect transistors that are incorporated into these integrated circuits.

SUMMARY

FIG. 1 illustrates an integrated circuit comprising a MOS transistor.

The MOS transistor T comprises an active zone 1 comprising two separate doped regions 2, 3, which are in particular doped with arsenic, phosphorus or boron, the region 2 forming the drain D of the transistor and the region 3 forming the source S of the transistor. The active zone 1 is covered by a silicon-oxide layer 4. A region 5 comprising polysilicon or a metal forms the gate G of the transistor and surmounts the oxide layer. The gate G is electrically insulated from the source S and the drain D by insulating lateral regions or "spacers" 6.

The gate has a length L, measured in the source-drain direction, and this length may be equal to the technological node used for the production of an integrated circuit incorporating this transistor. Thus, in a 40 nm technology, the length L may be equal to 40 nm.

The intrinsic electrical characteristics of a transistor, in particular its threshold voltage Vt and the ratio Ion/Ioff of its on-state current to the leakage current of the gate may be modified, for example by modifying the implant scheme of the drain and source regions, or by modifying the doping characteristics of the gate.

However, modifying doping, in particular when it is a question of the doping of the drain and source regions, is complex to do and economically very costly.

There is a need to be able to modify the electrical characteristics of such transistors by modifying, in a simple way, the conventional fabricating process while limiting the creation of new masks and not increasing volume with respect to current transistors.

SUMMARY

According to embodiments, it is advantageously proposed to continue to use existing doping masks but to modify the structure of the gate of the transistor by producing, at the foot of the gate, at least one stair that extends at least the entire width of the active zone, this thus making it possible to modify certain electrical characteristics of the transistor, such as for example its threshold voltage and/or Ion/Ioff ratio.

According to one aspect, an integrated circuit is proposed comprising at least one MOS transistor produced on and in an active zone including a source region, a drain region and having a width measured transversely to the source-drain direction, the transistor having a gate region comprising at its foot at least one stair that extends at least the entire width of the active zone.

According to one embodiment, when a single stair is produced, said at least one stair preferably lies on the side of the region of the drain.

According to another embodiment, the integrated circuit is produced in an L-nanometer technology, and the gate region includes a central zone having a length, measured transversely to said width, equal to L nanometers.

Thus, there is no difference between the central zone of the gate of a transistor with a stair and the conventional gate of a conventional transistor.

The technical effect of modification of certain electrical parameters of the transistor is obtained whatever the dimensions of the one or more stairs.

This being so, in particular for reasons of uniformity of the stair, the stair preferably has a length larger than the roughness of the gate region.

According to yet another embodiment, the stair has a length at least equal to 15 nm.

According to another embodiment, the stair has a height at least equal to 3 nm.

According to yet another embodiment, the gate region includes at its foot at least one stair that extends the entire width of the active zone on the side of the drain and at least one stair that extends the entire width of the active zone on the side of the source.

This simplifies production of the transistor.

The stairs may have different dimensions or indeed be identical.

The gate region includes flanks on which insulating lateral regions advantageously cover each stair.

According to another aspect, a process is proposed for producing a MOS transistor on and in an active zone of an integrated circuit, comprising forming a gate region including at its foot at least one stair that extends at least the entire width, measured transversely to the source-drain direction, of the active zone.

According to another implementation, the formation of the stair comprises a first etch of a layer of gate material so as to form a central gate zone and to leave behind, on both sides of the central zone, a residual layer of gate material, and a second etch of the residual layer so as to form said stair.

BRIEF DESCRIPTION OF THE DRAWINGS

Other advantages and features of the invention will become apparent on examining the detailed description of completely non-limiting embodiments and the appended drawings, in which:

FIG. 7-13 illustrate process steps for fabricating a transistor;

FIGS. 14-15 illustrate doping profiles for MOS transistors.

DETAILED DESCRIPTION

Figure 1:
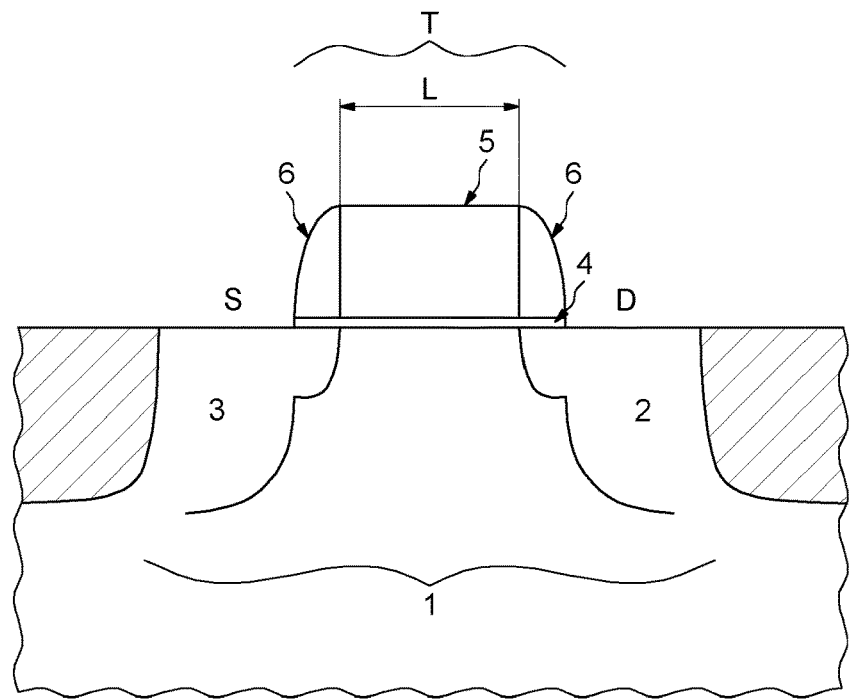
FIG. 1 illustrates an integrated circuit comprising a MOS transistor according to the prior art.
Figure 2:
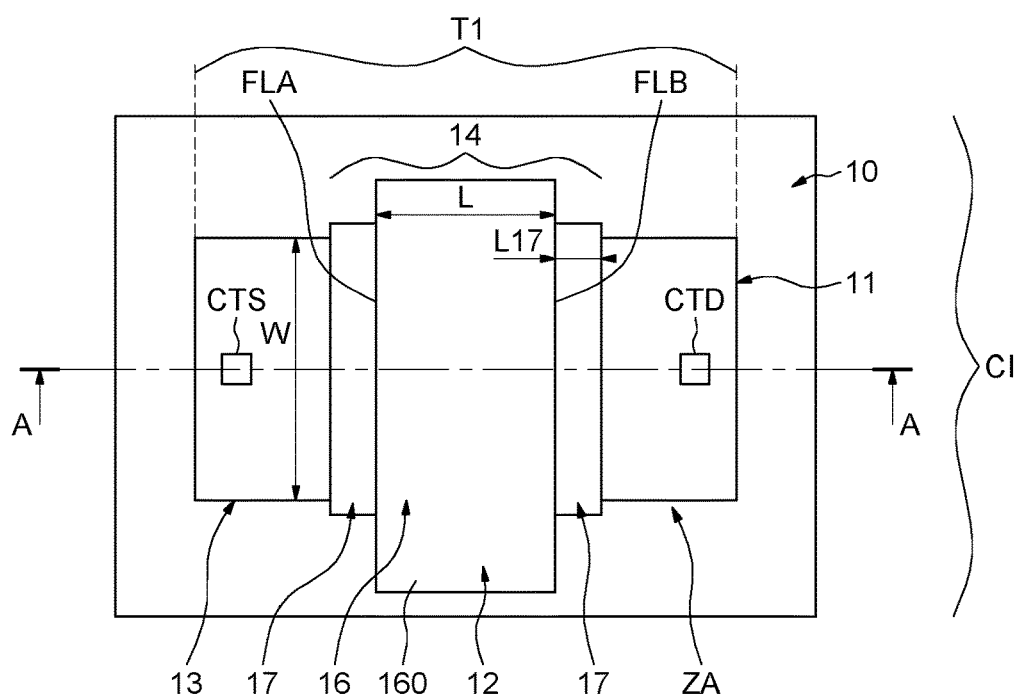
FIGS. 2-3 show an example of one embodiment of an integrated circuit comprising a MOS transistor.
Figure 3:
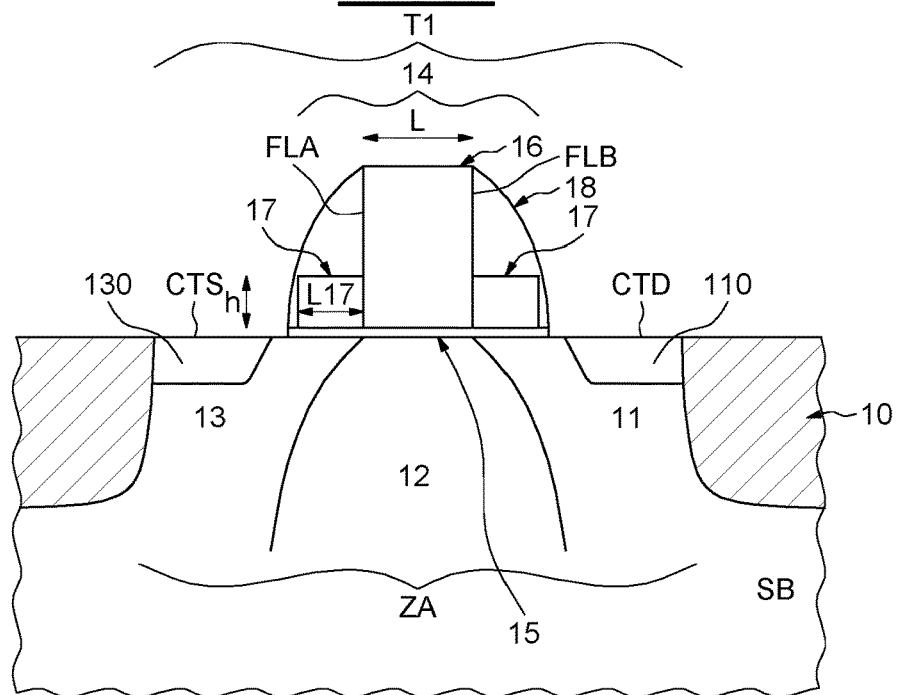

Reference is now made to FIGS. 2-3 which show an example of one embodiment of an integrated circuit comprising a MOS transistor.

FIG. 3 is a cross-sectional view of the integrated circuit CI of FIG. 2, taken along the section line A-A.

The integrated circuit CI comprises a MOS transistor T1 produced on and in an active zone ZA that is surrounded by an isolating region 10, for example of the shallow trench isolation (STI) type.

The active zone ZA includes a doped drain region 11 and a doped source region 13 that are separated by a channel region 12, all thereof being produced in a semiconductor substrate SB.

The substrate SB may be a bulk substrate or indeed a semiconductor well, or even a semiconductor film of a silicon-on-insulator (SOI) substrate.

In the case of an nMOS transistor, the source and drain regions are n-doped. The source and drain regions are instead p-doped for a pMOS transistor.

Conventionally, the source and drain regions are silicided in order to allow contacts CTS, CTD to be formed.

The references 110 and 130 designate the silicided portions of the drain and source regions 11, 13.

The transistor T1 also includes a gate region 14, which is insulated from the active zone by a dielectric layer 15, including a central zone 16 having a width W and a length L.

This length L is advantageously equal to the length L of a gate of a conventional transistor produced in an L-nm technology relating to the process node dimension.

L is for example equal to 40 nm.

The gate region 14 also includes an extension 160 that protrudes beyond the active zone ZA and rests on the isolating region 10 in order to allow a contact to be made to the gate region 14. With this in mind, the extension 160, and in practice all of the gate region 14, is silicided.

The gate region 14 includes, at its foot (also referred to herein as the base portion or bottom portion that is adjacent the gate insulating layer), on both sides, i.e. on the drain side and on the source side, a stair (also referred to herein as a step or protrusion) 17 that has a width L17 and a height h.

Each stair 17 extends at least the entire width W of the active zone and in practice may protrude onto the peripheral isolating region 10 in order to extend the entire width of the gate region 14 (central zone 16 and extension 160) for the sake of simplification of the gate etching mask.

The gate region 14 includes flanks FLA and FLB on which insulating lateral regions or spacers 18 completely cover sides and a top surface of each stair 17.

As will be seen in detail below, these stairs 17 will allow, during the doping of the drain and source regions, the doping profile of these regions to be modified and thus the electrical characteristics of the transistor T1, in particular its threshold voltage and the ratio Ion/Ioff of on-state current to leakage current, to be modified because the stair 17 forms an additional thickness for the dopants to pass through.

Advantageously, a modification of certain electrical parameters of the transistor T1 is obtained whatever the values of h and L17. It is within the ability of a person skilled in the art to adjust the values of h and L17 depending on the modifications desired for the parameters in question.

Preferably, the stair 17 has a length L17 larger than the roughness of the flanks FLA, FLV of the gate region 14, this making it possible to obtain a stair of uniform length L17 that is distinguishable from the intrinsic roughness of the gate material. For example, for a gate length L of 40 nm, the roughness is about 3 nm.

The inventors have observed that it is preferable for the height h to be larger than 3 nm, for example for h to be equal to 10 nm, and for L17 to be equal to 15 nm, for a 40 nm technology.

Figures 4, 5:
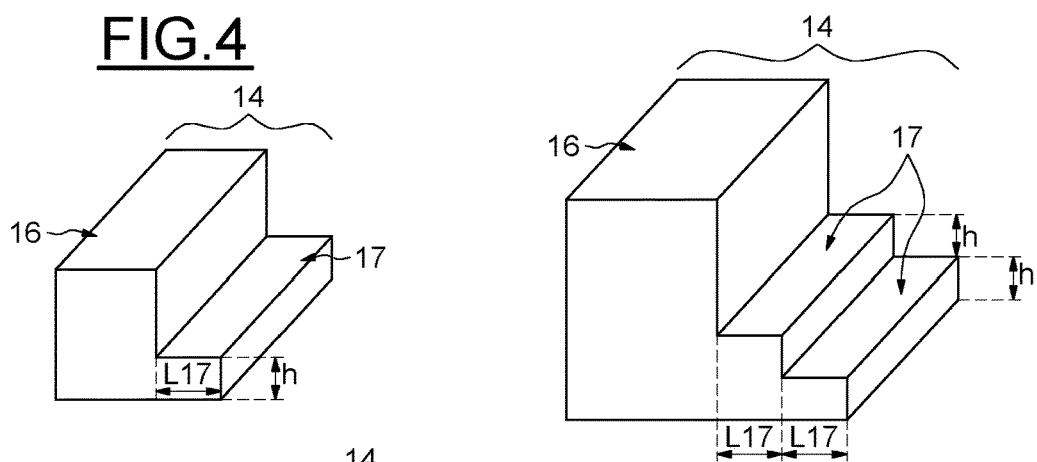
FIGS. 4-6 illustrate various stair configurations for the gate.

Although in the embodiment illustrated in FIGS. 2 and 3 the stairs 17 shown lie on both sides of the gate region 14, it is possible, as illustrated in FIG. 4, to make provision to produce only a single stair 17 on only one side.

This single stair 17 then preferably lies on the side of the region of the drain 11. Specifically, the drain region 11 is by convention biased differently from ground and it is therefore drain-side that the drain/substrate junction has a significant electrical impact under normal operating conditions.

Figure 6:
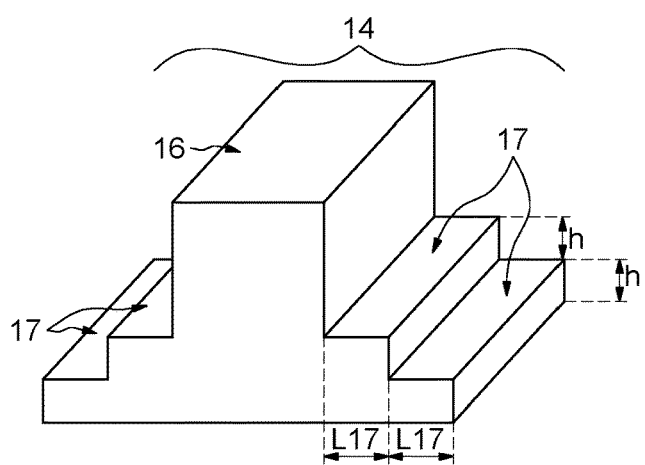

It is also possible, as illustrated in FIG. 5, to produce a plurality of stairs so as to form a staircase, preferably on the side of the drain region 11, or even to produce a staircase on each side of the gate region 14 as illustrated in FIG. 6.

In the case of a staircase, all the stairs of the staircase may have identical dimensions (i.e. parameters L17 and h that are identical) or indeed some thereof at least may have different dimensions.

An example of a process for fabricating a MOS transistor produced on and in an active zone and having a gate comprising on both sides, at its foot, a stair is now described. For example, the length L of the central gate zone of the MOS transistor is 40 nm and the stair has a length L17 of 15 nm and a height h of 3 nm. The gate is here made of polysilicon.

The critical dimension CD of the transistor is here equal to 40 nm. This transistor technology is still used, and the doping masks used in the fabrication of these transistors are the same as those of conventional transistors conventionally produced in this technology.

Elements that are identical to those described above have been identified by the same reference numbers.

FIG. 7 illustrates a first step in which a first etch of a resist layer for a CD equal to 40 nm is carried out.

More precisely, on the substrate SB a silicon-dioxide layer 20, surmounted by a polysilicon layer 21, itself surmounted with a hard-masking layer 22, which is surmounted with a resist layer 23, is formed in a conventional and known way. The resist 23 is etched by photolithography using an etching mask of CD equal to 40 nm, so as to leave behind only a resist block 230.

The polysilicon layer 21 here has a height H of 80 nm.

In a second step, which is illustrated in FIG. 8, a first conventional etch GR1 is carried out using the resist block 230 as etching mask. The polysilicon layer 21 is etched in the plasma and in time so as to leave behind, at the foot of the central zone 16 and optionally of the extension 160, a layer 170 of polysilicon of height h.

Next in step 3, which is illustrated in FIG. 9, a second resist mask MSK2 having a length CD2 of 70 nm is produced in a conventional way. The resist mask MSK2 protrudes on each side from the central zone 16 of the gate and by a length L17 here equal to 15 nm, which will define the length of the stair.

Figure 10:
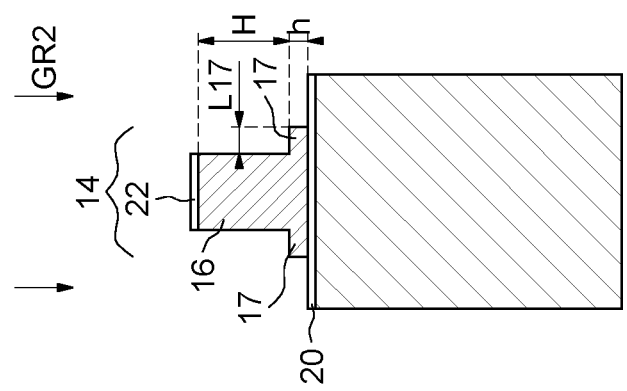

In step 4, which is illustrated in FIG. 10, a selective plasma etch GR2 is carried out. The gate 14 comprising the central zone 16 of height equal to H minus h and the stair 17 of height h and of length L17 are obtained.

Figure 11:
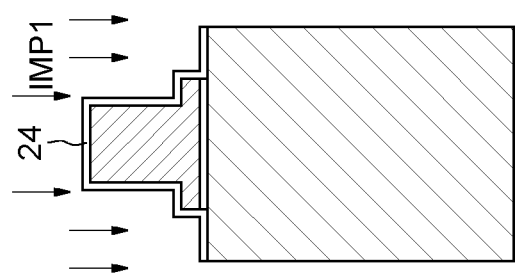
Figure 12:
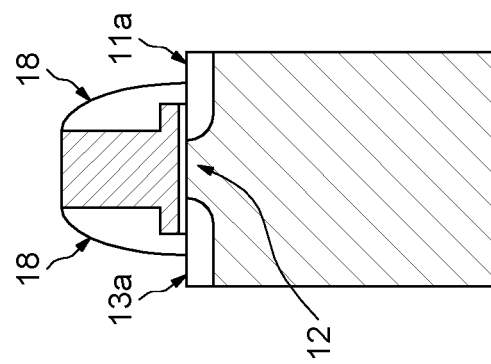

In step 5 of the process, which is illustrated in FIG. 11, a silicon-dioxide layer 24 is deposited on the gate 14 and the surface of the substrate SB, followed by a first implantation IMP1 of dopants, so as to obtain implanted regions 11a and 13a on both sides of the channel region 12 (FIG. 12).

In step 6, the spacers 18 are produced in a conventional way. They in particular cover the stairs 17.

In step 7, as illustrated in FIG. 13, a second implantation IMP2 of dopants is carried out so as to obtain the transistor T1 as illustrated in FIG. 14 with a dopant profile PFI that is different from a conventional dopant profile PFC such as that illustrated in FIG. 15.

The references 110 and 130 designate the silicided portions of the drain and source regions 11, 13.

It will be noted that under the stairs 17 the dopant profile PFI is different from the conventional profile PFC.

Under the stairs 17 the dopant profile PFI extends less deeply than the conventional profile PFC.

By way of example, for L equal to 40 nm and a stair on either side of the gate region of L17 equal to 15 nm and h equal to 3 nm, the threshold voltage of the transistor is increased by 100 mV, and the Ion/Ioff ratio is higher than 5.

Advantageously, the one or more stairs on one side or on both sides of the foot of the gate modify the distribution of the dopants implanted in the gate, drain and source regions in the doping step of the fabricating process of the transistors.

This modification of the doping profile leads to a modification of the electrical properties of the transistor T1, in particular its threshold voltage Vt and the ratio Ion/off of on-state current to leakage current. The Ion/Ioff ratio is improved.

Moreover, an increase in the Ion to Ioff ratio is obtained. This is particularly advantageous for ultra-low-power (ULP) applications.

These improvements lead to the creation of only a single additional gate etching mask and to the addition of two steps to the process for fabricating the transistor, no modification of the conventional steps of MOS transistor fabrication being required. In addition, the critical dimension CD of the transistor is preserved, and the doping masks used in conventional transistor fabrication steps are also preserved. In addition, stairs may be produced in the two types of MOS transistors (pMOS and nMOS) with a single mask. In other words, the threshold voltage of pMOS and nMOS transistors may be modified with a single mask.

The invention claimed is:

1. An integrated MOS transistor, comprising:
   an active zone including a source region and a drain region of the integrated MOS transistor, the active zone being surrounded by an insulating region;
   a conductive gate region of the integrated MOS transistor extending transversely to a source-drain direction and overlapping two opposite edges of the active zone at overlap zones;
   wherein the conductive gate region includes a central zone having a first height; and
   wherein the conductive gate region further includes, at a location of one of the source region or drain region:
   a first conductive stair projecting perpendicularly from the central zone and extending along an entirety of the width of the active zone and further covering parts of the insulating region, the first conductive stair having a second height which is less than the first height; and
   a second conductive stair above the first conductive stair and projecting perpendicularly from the central zone and extending along an entirety of the width of the active zone and further covering parts of the insulating region, the second conductive stair having a third height which is less than the first height.

2. The integrated MOS transistor according to claim 1, wherein the conductive gate region includes first and second conductive stairs at the location of both the source region and the drain region.

3. The integrated MOS transistor according to claim 1, further comprising insulating lateral spacers on flanks of the conductive gate region, wherein the insulating lateral spacers completely cover said flanks and sides and a top surface of the first and second conductive stairs but do not cover a top surface of the central zone.

4. An integrated circuit, comprising:
   at least one MOS transistor produced on and in an active zone and including a source region and a drain region, wherein the active zone has a width measured transversely to a source-drain direction;
   wherein the transistor has a conductive gate region comprising a central zone and, at a foot of the central zone of the conductive gate region, at least one stair that extends beyond the central zone at least along an entirety of the width of the active zone;
   wherein the conductive gate region includes flanks;
   insulating lateral spacers adjacent said flanks which cover said at least one stair; and
   wherein the insulating lateral spacers completely cover sides and a top surface of said at least one stair but do not extend to cover a top surface of said central zone.

5. The integrated circuit according to claim 4, wherein said at least one stair lies on a side of the central zone over the drain region.

6. The integrated circuit according to claim 4, wherein said at least one stair has a length, measured transversely to said width, larger than a roughness of the conductive gate region.

7. The integrated circuit according to claim 4, wherein said at least one stair has a length, measured transversely to said width, at least equal to 15 nm.

8. The integrated circuit according to claim 4, wherein said at least one stair has a height at least equal to 3 nm.

9. The integrated circuit according to claim 4, wherein said at least one stair comprises a first stair that extends along the entirety of the width of the active zone over the drain region and a second stair that extends along the entirety of the width of the active zone over the source region.

10. The integrated circuit according to claim 9, wherein the first and second stairs have identical dimensions.

* * * * *